United States Patent
Yu

[19]

[11] Patent Number: 5,940,726
[45] Date of Patent: Aug. 17, 1999

[54] METHOD FOR FORMING AN ELECTRICAL CONTACT FOR EMBEDDED MEMORY

[75] Inventor: Chen-hua Yu, Hsin-chu, Taiwan

[73] Assignee: Taiwan Semiconductor Manufacturing Company, Ltd., Hisn-Chu, Taiwan

[21] Appl. No.: 08/965,310

[22] Filed: Nov. 6, 1997

[51] Int. Cl.⁶ .................................................. H01L 21/44
[52] U.S. Cl. .......................... 438/597; 438/643; 438/533
[58] Field of Search ................... 438/597, 514, 438/516, 520, 523, 528, 533, 643, 648, 649, 653, 682

[56] References Cited

U.S. PATENT DOCUMENTS

| | | | |
|---|---|---|---|
| 4,954,214 | 9/1990 | Ho .......................................... | 156/628 |
| 5,102,826 | 4/1992 | Ohshima et al. ..................... | 437/200 |
| 5,236,865 | 8/1993 | Sandhu et al. ....................... | 437/174 |
| 5,401,674 | 3/1995 | Anjum et al. ........................ | 438/659 |
| 5,541,131 | 7/1996 | Yoo et al. ............................. | 437/44 |
| 5,637,533 | 6/1997 | Choi ..................................... | 438/643 |
| 5,712,193 | 1/1998 | Hower et al. ........................ | 438/643 |
| 5,770,517 | 6/1998 | Gardner et al. ..................... | 438/627 |
| 5,801,086 | 1/1998 | Lee ....................................... | 438/659 |
| 5,851,912 | 12/1998 | Liaw et al. .......................... | 438/627 |

*Primary Examiner*—Tuan H. Nguyen
*Attorney, Agent, or Firm*—George O. Saile; Stephen B. Ackerman; Rosemary L. S. Pike

[57] ABSTRACT

An improved method of forming a good electrical contact within a deep contact opening is described. Semiconductor device structures in and on a semiconductor substrate are covered with a dielectric layer. A contact opening is etched through the dielectric layer to the semiconductor substrate where the good electrical contact is to be made wherein the contact opening has an aspect ratio greater than one and wherein contaminants are found on the surface of the semiconductor substrate at the bottom of the contact opening. A titanium layer is deposited overlying the dielectric layer and within the contact opening. Silicon ions are implanted into the substrate at a vertical implant wherein the peak implant dose is targeted for the interface between the titanium layer and the semiconductor substrate within the contact opening. Thereafter, the substrate is annealed whereby the titanium layer is transformed into titanium silicide and whereby the contaminants are broken up and thereafter depositing a metal layer within the contact opening to complete a good electrical contact in the fabrication of an integrated circuit device.

32 Claims, 4 Drawing Sheets

METHOD FOR FORMING AN ELECTRICAL CONTACT FOR EMBEDDED MEMORY

BACKGROUND OF THE INVENTION (1) Field of the Invention

The present invention relates to the fabrication of integrated circuit devices, and more particularly, to a method of improving the deep contact processing window in the fabrication of integrated circuits.

(2) Description of the Prior Art

In the fabrication of integrated circuit devices with embedded memory, many interlevel dielectric layers exist between the substrate and the first metal lines. This makes for high aspect ratio contacts; that is, contact openings in which the ratio of height to width of the opening is greater than one. It is difficult to complete electrical contacts with high aspect ratios. Specifically, it is difficult to remove contaminants from the contact openings after etching. The contaminants prevent the formation of a good electrical contact. It is desired to find a method of forming good electrical contacts in high aspect ratio contact openings.

Silicidation has been used widely in the art. A refractory metal layer is deposited and then annealed. The underlying silicon reacts with the refractory metal layer to produce a silicide. U.S. Pat. No. 5,541,131 to Yoo et al shows a method of implanting silicon ions into a metal silicide layer as a source of silicon for silicidation during annealing. U.S. Pat. No. 5,236,865 to Sandhu et al teaches laser irradiation to simultaneously produce a silicide and activate dopants. U.S. Pat. No. 5,102,826 to Ohshima et al teaches implanting silicon ions into the substrate along with the dopant for forming junctions, depositing a titanium layer, then annealing for silicidation and activation where the implanted silicon ions suppress consumption of silicon in the substrate during silicidation. U.S. Pat. No. 4,954,214 to Ho teaches implanting silicon ions through openings in a molybdenum mask to act as seed material for selective deposition of tungsten.

SUMMARY OF THE INVENTION

Accordingly, it is a primary object of the present invention to provide an effective and very manufacturable method for improving the deep contact processing window in the fabrication of integrated circuits.

It is a further object of the invention to provide a process for improving the deep contact processing window for embedded memory products.

Yet another object is to break up contaminants and residual oxides within a deep contact opening in order to form a good electrical contact in the fabrication of an integrated circuit device.

In accordance with the objects of the invention, an improved method of forming a good electrical contact within a deep contact opening is achieved. Semiconductor device structures in and on a semiconductor substrate are covered with a dielectric layer. A contact opening is etched through the dielectric layer to the semiconductor substrate where the good electrical contact is to be made wherein the contact opening has an aspect ratio greater than one and wherein contaminants are found on the surface of the semiconductor substrate at the bottom of the contact opening. A titanium layer is deposited overlying the dielectric layer and within the contact opening. Silicon ions are implanted into the substrate at a vertical implant wherein the peak implant dose is targeted for the interface between the titanium layer and the semiconductor substrate within the contact opening. Thereafter, the substrate is annealed whereby the titanium layer is transformed into titanium silicide and whereby the contaminants are broken up and thereafter depositing a metal layer within the contact opening to complete a good electrical contact in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
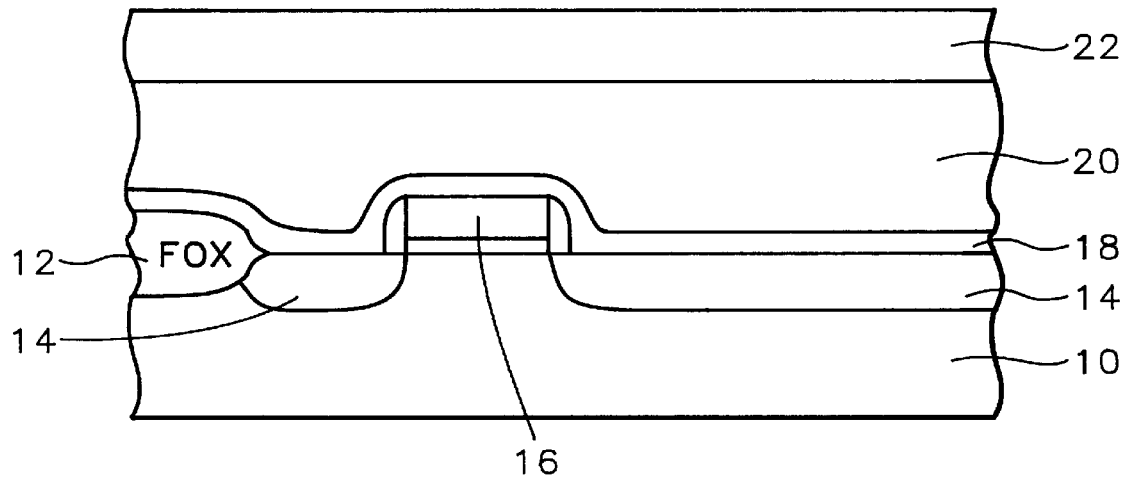
FIGS. 1 through 8 are cross-sectional representations of a preferred embodiment of the present invention.

Referring now more particularly to FIG. 1, there is shown a semiconductor substrate 10, in which may be formed semiconductor device structures which may include polysilicon gate electrode 16 and source and drain regions 14. Active regions may be separated by Field OXide regions 12. A liner layer 18 may be composed of silicon oxide having a thickness of between about 200 and 4000 Angstroms. Interlevel dielectric layers such as 20 and 22 are deposited over the semiconductor device structures. These layers may comprise borophospho-tetraethoxysilane (BP-TEOS) oxide, borophosphosilicate glass (BPSG), phosphosilicate glass (PSG), or a combination of BPSG and silicon dioxide, and so on. More than the two layers 20 and 22 illustrated may be deposited. The total thickness of the layers 20 and 22 is typically between about 2000 and 15,000 Angstroms. The topmost interlevel dielectric layer 22 is planarized, for example by reflowing of the dielectric material, etchback, or chemical mechanical polishing, or the like.

Figure 2:
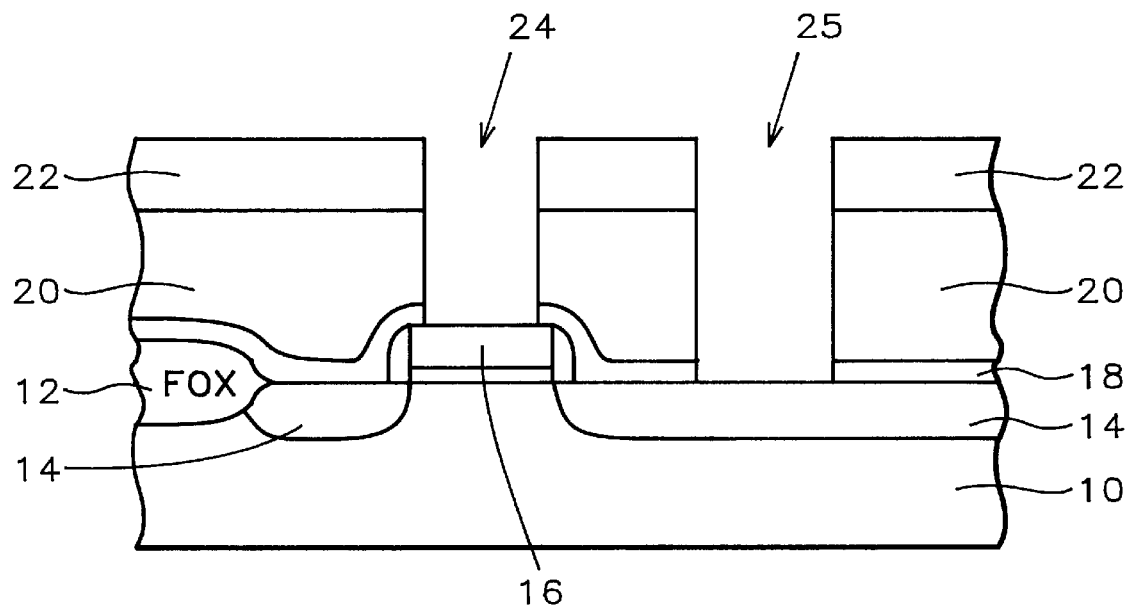

Referring now to FIG. 2, contact openings 24 and 25 are defined and etched through to the underlying semiconductor device structure to be contacted, such as the gate electrode 16 (opening 24) or the source/drain junction 14 (opening 25) in the semiconductor substrate.

Because of the thick multi-layer interlevel dielectric, the contact openings 24 and 25 are deep with high aspect ratios. That is, the depth of the openings is much greater than the width of the openings. Polymer buildup from the lithographic mask used in etching or residual oxide may be found within the contact openings after etching. Because of the high aspect ratio of the contact openings, it is difficult to remove these contaminants completely. The presence of the contaminants may prevent a good electrical connection.

Figure 3:
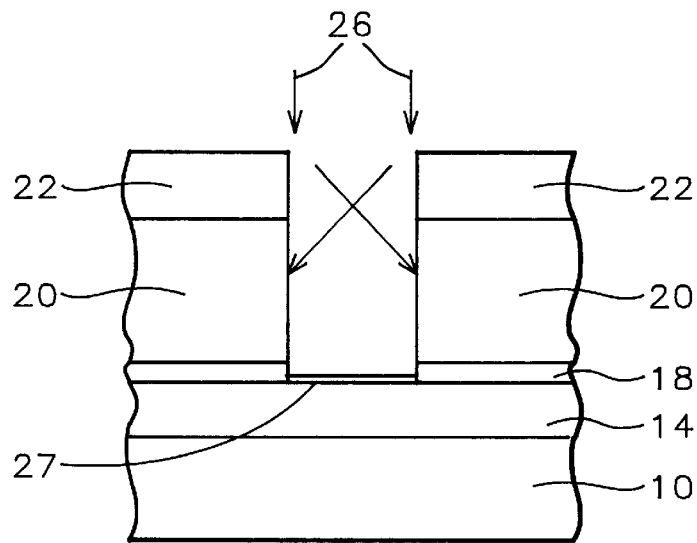

Typically, polymers and residual oxides within contact openings are removed by wet or dry cleaning techniques, or a combination of the two. A dry plasma cleaning technique involves sputtering the wafer with Argon ions to remove the contaminants. It is difficult to get the Argon ions all the way into the opening and it is difficult to get the sputtered material out. FIG. 3 illustrates a close-up view of contact opening 25. A layer of contaminants 27 is shown at the bottom of the opening. Argon ions 26 are sputtered onto the wafer. The ions do not reach all the way into the bottom of the opening because it is so narrow and so deep.

A typical wet cleaning process is a hydrofluoric acid (HF) dip. It is difficult to send the HF solution into the opening and difficult to get the etched materials out again.

In the process of the present invention, preferably a dry plasma technique is used to remove the photoresist mask and polymer buildup. A wet clean to remove residual oxide and/or polymer contaminants may be performed, but is not necessary. Some contaminants will remain at the bottom of the contact openings.

Figure 4:
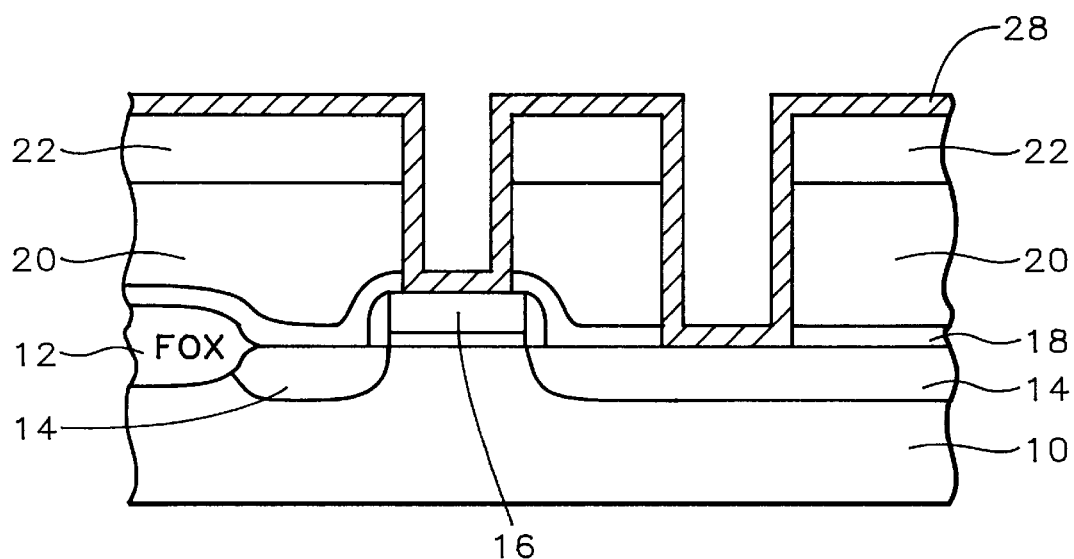

Referring now to FIG. 4, the key processes of the present invention will be described. A barrier metal layer 28 is deposited over the surface of dielectric layer 22 and over the bottom and sidewalls of the contact openings. This layer will serve as a glue layer. The barrier metal layer may be formed by physical vapor deposition (PVD); i.e. sputtering, or by chemical vapor deposition (CVD). A layer of titanium 28, or other metal such as cobalt, nickel, and the like, is deposited to a thickness of between about 100 and 1000 Angstroms.

Figure 5:
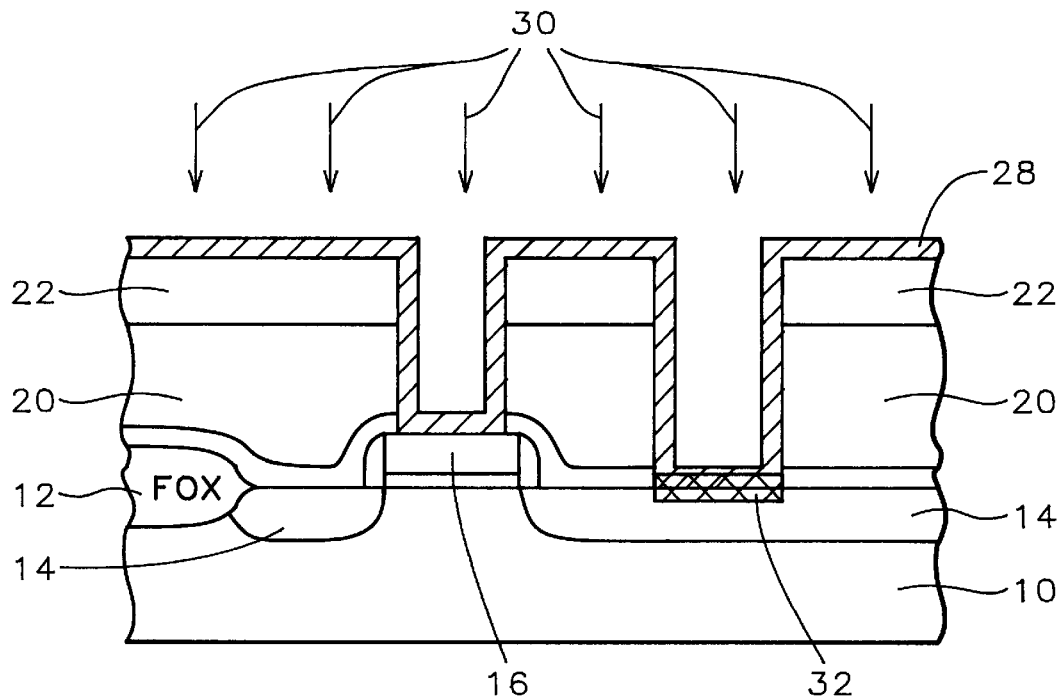
Figure 6:
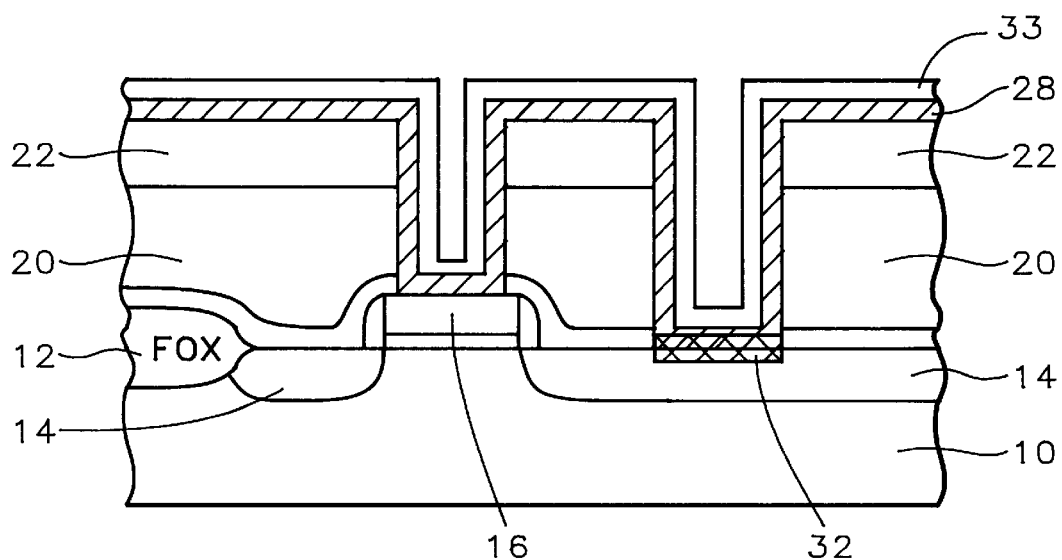

Referring now to FIG. 5, silicon ions are implanted into the substrate at a zero degree tilt angle; that is, a vertical implant. The implant dose peak position is targeted at the titanium and silicon substrate interface, or slightly farther into the silicon substrate, as illustrated by 32. A layer of titanium nitride 33 now may optionally be deposited overlying the titanium layer, as illustrated in FIG. 6. The titanium nitride layer will serve to protect the titanium silicide from oxidation during subsequent annealing steps. The optional titanium nitride layer will not be shown in the remaining figures.

Figure 7:
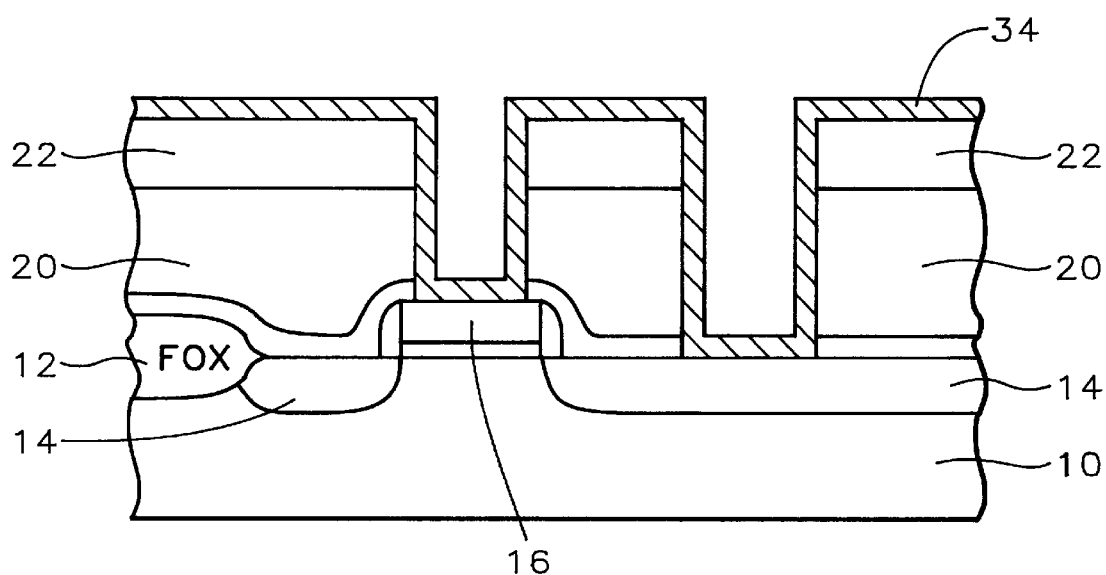

The wafer is exposed to a rapid thermal anneal in a nitrogen ambient to silicidate the titanium. The implanted silicon ions 32 provide sufficient silicon for the silicidation. Most of these silicon ions are consumed by the silicidation reaction. Titanium silicide ($TiSi_2$) layer 34 is formed, as shown in FIG. 7.

The reaction of titanium and silicon to form titanium silicide is a reaction in which a large amount of mass transfer and diffusion is involved. Barriers such as between residual oxide or polymers will be broken by ion bombardment from this reaction. The annealing breaks up the leftover contaminants and/or residual oxide at the bottom of the contact openings. The broken up contaminants will be merged harmlessly into the titanium silicide structure.

Figure 8:
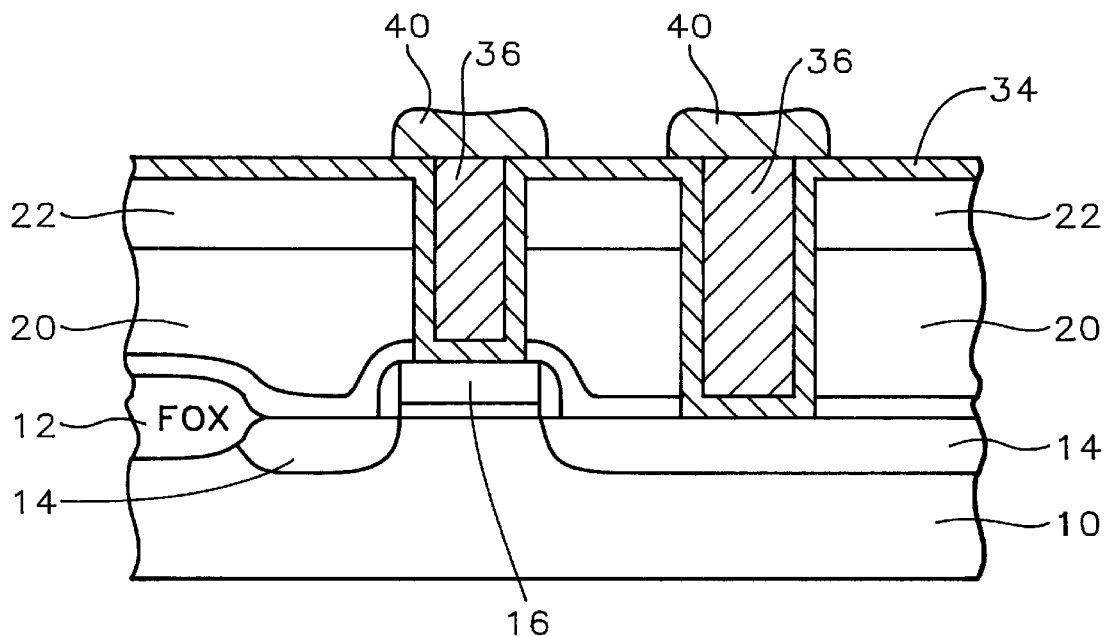

Processing continues as is conventional in the art to fill the contact openings. For example, tungsten is deposited and etched back to form tungsten plugs 36, as illustrated in FIG. 8. A layer of aluminum or AlSiCu 40 is deposited and patterned to complete the electrical connections for the embedded memory device to be fabricated.

The process of the present invention greatly improves the deep contact processing window, especially for embedded memory products, but also for any other integrated circuit devices in which deep or high aspect ratio contacts are needed. The process of the present invention can be used for contacts having an aspect ratio of greater than 4, typically, but the aspect ratio may be as high as 6–10.

While the invention has been particularly shown and described with reference to the preferred embodiments thereof, it will be understood by those skilled in the art that various changes in form and details may be made without departing from the spirit and scope of the invention.

What is claimed is:

1. A method of forming a electrical contact in the fabrication of an integrated circuit comprising:

providing semiconductor device structures in and on a semiconductor substrate;

covering said semiconductor device structures with a dielectric layer;

etching a contact opening through said dielectric layer to said semiconductor substrate where said electrical contact is to be made wherein said contact opening has an aspect ratio greater than one and wherein contaminants are found on the surface of said semiconductor substrate at the bottom of said contact opening;

depositing a barrier metal layer overlying said dielectric layer and within said contact opening;

implanting silicon ions into said substrate at a vertical implant wherein the peak implant dose is targeted for the interface between said barrier metal layer and said semiconductor substrate within said contact opening;

thereafter annealing said substrate whereby said barrier metal layer is silicidated and whereby said contaminants are broken up and merged into said silicidated barrier metal layer;

thereafter depositing a metal layer within said contact opening to complete said electrical contact in the fabrication of said integrated circuit device.

2. The method according to claim 1 wherein said integrated circuit device is an embedded memory device.

3. The method according to claim 1 wherein said semiconductor device structures include gate electrodes and source and drain regions.

4. The method according to claim 1 wherein said dielectric layer comprises multiple layers having a thickness of between about 2000 and 15,000 Angstroms.

5. The method according to claim 1 wherein said aspect ratio is greater than 4.

6. The method according to claim 1 wherein said aspect ratio is between 6 and 10.

7. The method according to claim 1 wherein said contaminants comprise polymer buildup and residual oxide.

8. The method according to claim 1 wherein said barrier metal layer comprises titanium.

9. The method according to claim 1 further comprising depositing a titanium nitride layer overlying said barrier metal layer.

10. The method according to claim 1 wherein said barrier metal layer comprises cobalt.

11. The method according to claim 1 wherein said barrier metal layer comprises nickel.

12. The method according to claim 1 wherein said contaminants are broken up by ion bombardment during said annealing whereby said barrier metal layer is silicidated.

13. A method of forming a electrical contact in the fabrication of an integrated circuit comprising:

providing semiconductor device structures in and on a semiconductor substrate;

covering said semiconductor device structures with a dielectric layer;

etching a contact opening through said dielectric layer to said semiconductor substrate where said electrical contact is to be made wherein said contact opening has an aspect ratio greater than four and wherein contaminants are found on the surface of said semiconductor substrate at the bottom of said contact opening;

depositing a titanium layer overlying said dielectric layer and within said contact opening;

implanting silicon ions into said substrate at a vertical implant wherein the peak implant dose is targeted for the interface between said titanium layer and said semiconductor substrate within said contact opening;

thereafter annealing said substrate whereby said titanium layer is transformed into titanium silicide and whereby said contaminants are broken up; and thereafter depositing a metal layer within said contact opening to complete said electrical contact in the fabrication of said integrated circuit device.

14. The method according to claim 13 wherein said integrated circuit device is an embedded memory device.

15. The method according to claim 13 wherein said semiconductor device regions include gate electrodes and source and drain regions.

16. The method according to claim 13 wherein said dielectric layer comprises multiple layers having a thickness of between about 2000 and 15,000 Angstroms.

17. The method according to claim 13 wherein said aspect ratio is greater between 6 and 10.

18. The method according to claim 13 wherein said contaminants comprise polymer buildup and residual oxide.

19. The method according to claim 13 wherein said after said etching of said contact opening, a dry plasma cleaning process is performed.

20. The method according to claim 19 wherein said after said dry plasma cleaning process, a wet cleaning process using hydrofluoric acid is performed.

21. The method according to claim 13 further comprising depositing a titanium nitride layer overlying said titanium layer after said implanting said silicon ions.

22. The method according to claim 13 wherein said contaminants are broken up by ion bombardment during said annealing and wherein said broken up contaminants are merged into said titanium silicide layer.

23. A method of forming a eletrical contact in the fabrication of an integrated circuit comprising:

providing semiconductor device structures in and on a semiconductor substrate;

covering said semiconductor device structures with a dielectric layer;

etching a contact opening through said dielectric layer to said semiconductor substrate where said electrical contact is to be made wherein said contact opening has an aspect ratio greater than four and wherein contaminants are found on the surface of said semiconductor substrate at the bottom of said contact opening;

depositing a barrier metal layer overlying said dielectric layer and within said contact opening;

implanting silicon ions into said substrate at a vertical implant wherein the peak implant dose is targeted for the interface between said barrier metal layer and said semiconductor substrate within said contact opening;

thereafter annealing said substrate whereby said barrier metal layer is silicidated and whereby said contaminants are broken up by ion bombardment during said annealing and merged into said silicidated barrier metal layer;

thereafter depositing a metal layer within said contact opening to complete said electrical contact in the fabrication of said integrated circuit device.

24. The method according to claim 23 wherein said integrated circuit device is an embedded memory device.

25. The method according to claim 23 wherein said semiconductor device structures include gate electrodes and source and drain regions.

26. The method according to claim 23 wherein said dielectric layer comprises multiple layers having a thickness of between about 2000 and 15,000 Angstroms.

27. The method according to claim 23 wherein said aspect ratio is between 6 and 10.

28. The method according to claim 23 wherein said contaminants comprise polymer buildup and residual oxide.

29. The method according to claim 23 wherein said barrier metal layer comprises titanium.

30. The method according to claim 23 further comprising depositing a titanium nitride layer overlying said barrier metal layer.

31. The method according to claim 23 wherein said barrier metal layer comprises cobalt.

32. The method according to claim 23 wherein said barrier metal layer comprises nickel.

* * * * *